(12) United States Patent
Jeong et al.

(10) Patent No.: US 8,230,295 B2
(45) Date of Patent: Jul. 24, 2012

(54) APPARATUS AND METHOD FOR TRANSMITTING AND RECEIVING DATA IN A COMMUNICATION SYSTEM USING LOW DENSITY PARITY CHECK CODE

(75) Inventors: Hong-Sil Jeong, Seoul (KR); Seho Myung, Suwon-si (KR); Sung-Ryul Yun, Suwon-si (KR); Hak-Ju Lee, Incheon (KR); Jae-Yoel Kim, Suwon-si (KR); Young-Uk Do, Anyang-si (KR); Seok-Ki Ahn, Gumi-si (KR); Kyeong-Cheol Yang, Seoul (KR); Hyun-Koo Yang, Seoul (KR)

(73) Assignees: Samsung Electronics Co, Ltd., Samsung-Ro, Yeongtong-Gu, Suwon-Si, Gyeonggi-Do (KR); Postech Academy Industry Foundation, Hyoja-Dong, Nam-Gu, Pohang-Si, Gyeong Sangbuk-Do (KR)

( * ) Notice: Subject to any disclaimer, the term of this patent is extended or adjusted under 35 U.S.C. 154(b) by 926 days.

(21) Appl. No.: 12/267,658

(22) Filed: Nov. 10, 2008

(65) Prior Publication Data
US 2009/0125781 A1   May 14, 2009

(30) Foreign Application Priority Data
Nov. 8, 2007   (KR) .......................... 10-2007-0113641

(51) Int. Cl.
*H03M 13/00* (2006.01)
(52) U.S. Cl. ........................................ 714/752
(58) Field of Classification Search .......... 714/750–757, 714/762–768, 780–797, 799
See application file for complete search history.

(56) References Cited

U.S. PATENT DOCUMENTS

| | | | | |
|---|---|---|---|---|
| 6,792,569 | B2 * | 9/2004 | Cox et al. ....................... | 714/781 |
| 7,389,464 | B2 * | 6/2008 | Jeong et al. .................... | 714/752 |
| 7,451,386 | B2 * | 11/2008 | Shen et al. ..................... | 714/801 |
| 7,467,346 | B2 * | 12/2008 | Hassner et al. ................ | 714/781 |
| 7,600,180 | B2 * | 10/2009 | Shen et al. ..................... | 714/801 |

(Continued)

FOREIGN PATENT DOCUMENTS

| | | |
|---|---|---|
| KR | 2006-97503 | 9/2006 |
| KR | 2007-58480 | 6/2007 |

OTHER PUBLICATIONS

Kim, Ki-Hyun, et al.; Patent Application Publication No: US 2007/0186139 A1; Publication Date: Aug. 9, 2007; "Interleaving Method for Low Density Parity Check Encoding;". . . .

(Continued)

*Primary Examiner* — Nadeem Iqbal
(74) *Attorney, Agent, or Firm* — Cha & Reiter, LLC (57) ABSTRACT

A method for transmitting data in a communication system using a Low Density Parity Check (LDPC) matrix includes generating an LDPC codeword by encoding information data bits, interleaving the LDPC codeword, mapping the interleaved LDPC codeword to a modulation signal, and generating a mapped signal by mapping the LDPC codeword bits separately to a bit corresponding to a real part and a bit corresponding to an imaginary part of said modulation signal, among bits constituting the modulation signal, generating a modulation signal by high-order-modulating the mapped signal and Radio Frequency (RF)-processing the modulation signal, and transmitting the RF-processed signal via a transmission antenna.

20 Claims, 8 Drawing Sheets

U.S. PATENT DOCUMENTS

2004/0258177 A1* 12/2004 Shen et al. .................... 375/308
2007/0124644 A1* 5/2007 Shen et al. .................... 714/752

OTHER PUBLICATIONS

Kim, Ki-Hyun, et al.; Patent Application Publication No: US 2004/0199860 A1; Publication Date: Oct. 7, 2004; "Method and Apparatus for Generating Parity Information For Error . . .;". . . .

DVB Organization; "Call For Technology Response: Frame Structure, Channel Coding and Modulation For Entire DVB-T2 Baseline System Proposal; Part I—First Phase of DVB-T2;" Samsung Electronics Co., Ltd, Proposal for DVB-T2; Jun. 4, 2007; XP017817440.

DVB Organization; "Bit Interleaver and Bit Mapping Into Constellation in T2 Baseline;" Sep. 17, 2007; XP017817137.

DVB Organization; "RAI Reply to TM-3719r3 DVB-TM-T2 Call For Technologies;" Version 1.0; Jun. 4, 2007; XP017817438.

Li, Yan, et al.; "Bit-Reliability Mapping in LDPC-Coded Modulation Systems;" IEEE Communications Letters; vol. 9, No. 1; Jan. 1, 2005; XP001211457.

* cited by examiner $$H_1 = \begin{bmatrix} 1 & 1 & 1 & 1 & 1 & 1 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{bmatrix}$$

APPARATUS AND METHOD FOR TRANSMITTING AND RECEIVING DATA IN A COMMUNICATION SYSTEM USING LOW DENSITY PARITY CHECK CODE

CLAIM OF PRIORITY

This application claims the benefit of the earlier filing date, pursuant to 35 U.S.C. §119(a), to that Korean Patent Application filed in the Korean Intellectual Property Office on Nov. 8, 2007 and assigned Serial No. 2007-113641, the disclosures of which are incorporated herein by reference.

BACKGROUND OF THE INVENTION

1. Field of the Invention

The present invention relates wireless communication systems, and in particular, to an apparatus and method for transmitting and receiving data in a communication system using Low Density Parity Check (LDPC) codes.

2. Description of the Related Art

Generally, in communication systems, a data transmission/reception process can be outlined as: data generated in a source of a transmission side is wirelessly transmitted over a channel after undergoing source coding, channel coding, interleaving, and modulation and after receiving the wirelessly transmitted signal at the reception side, the reception side performs demodulation, deinterleaving, channel decoding, and source decoding on the received signal.

However, in communication systems, distortion of signals occurs due to various noises, fading phenomena and Inter-Symbol Interference (ISI) of within and among the different transmission channels. In the high-speed digital communication system requiring high data throughput and high reliability, such as next-generation mobile communication, digital broadcasting and portable internet, a technology for coping with signal distortion caused by the noises, fading and ISI is indispensable. The channel coding and interleaving are typical of technologies that are used to mitigate the effects of noise fading and ISI in distorting transmitted signals.

Interleaving is used for minimizing a data transmission loss and increasing a channel coding effect, as is more fully described below, by distributing a damaged portion of desired transmission bits over several places without concentrating the damaged portion on a single spot. The concentration of distorted bits is known in the art as a burst error which frequently occurs while a signal passes through a fading channel, and the distribution of the damaged portion over several places is used reduce the occurrence of a burst error within the transmission stream Channel coding is popularly used as a method for allowing a reception side to check signal distortion caused by noises, fading and ISI, and to efficiently restore the distorted signal, thereby increasing communication reliability. Codes used for channel coding are called Error-Correcting Codes (ECCs) as they enable the reception side to correct errors that have been detected. Intensive research is being conducted on various types of error-correcting codes.

The well-known error-correcting codes include block codes, convolutional codes, turbo codes, and LDPC codes. Since the present invention is directed to a communication system using LDPC codes, a brief description of the LDPC codes is provided.

The LDPC code is known as a code that can minimize information loss probability though it cannot guarantee perfect transmission of signals. The LDPC code, which was first proposed in 1960s, is the first channel coding code capable of transmitting signals at a rate approximating the maximum data rate (i.e., the Shannon limit) which is known in Shannon's channel coding theory. The LDPC code could not be substantially used since the -technology level in the 1960s was not sufficiently advanced to realize the LDPC code. However, as the LDPC code was rediscovered around 1996 owing to the succeeding information theory and the progress of technologies, a study is being made of characteristics of the LDPC code showing that its complexity does not considerably increase even though it uses iterative decoding, and a study is also being made of a method for generating the LDPC code. The LDPC code, together with the turbo code, is being suggested as a very superior error-correcting code useful for the next-generation mobile communication system. The LDPC code is commonly expressed using a graph representation, and its many characteristics can be analyzed using methods based on graph theory, algebra, and probability theory. Generally, a graph model of channel codes is useful for descriptions of codes, and if information on each coded bit corresponds to a vertex in the graph and relationships between the coded bits correspond to edges in the graph, the vertexes can be considered as communication networks that exchange predetermined messages through the edges, making it possible to derive a natural decoding algorithm. For example, decoding algorithms induced from the trellis that can be regarded as a kind of graph can include the well-known Viterbi algorithm and Bahl, Cocke, Jelinek and Raviv (BCJR) algorithm. As such codes are well known in the art, a discussion of same need not be provided herein.

The LDPC code is generally defined as a parity-check matrix, and can be represented using a bipartite graph, commonly referred to as a Tanner graph. The bipartite graph means that vertexes constituting the graph are divided into two different types, and for the LDPC code, the vertexes of two different types are variable nodes and check nodes. The variable nodes one-to-one correspond to coded bits.

Figure 1:
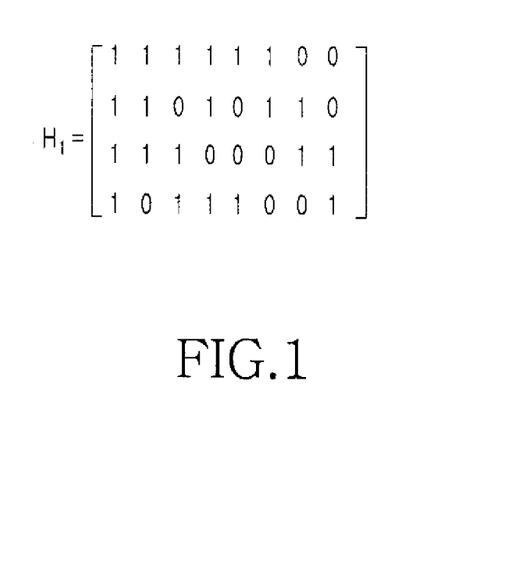
FIG. 1 is a diagram illustrating an exemplary parity-check matrix $H_1$ of an LDPC code.
Figure 2:
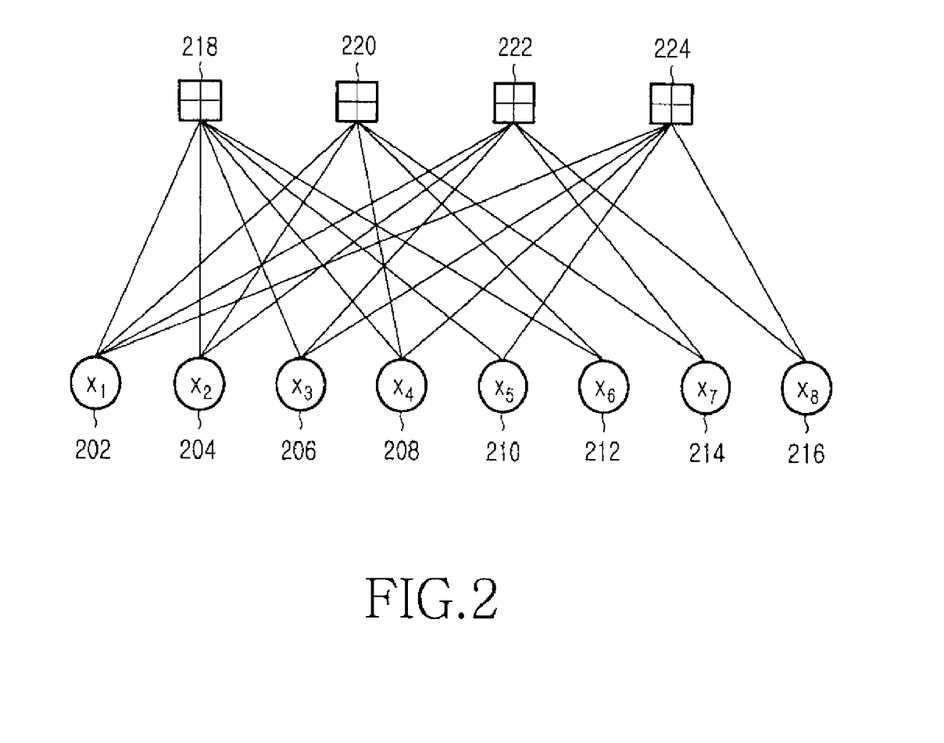
FIG. 2 is a graph representation for an exemplary parity-check matrix $H_1$ of an LDPC code.

With reference to FIGS. 1 and 2, a description is illustrated of an exemplary graphical representation of the LDPC code.

FIG. 1 is a diagram illustrating a parity-check matrix $H_1$ of an LDPC code. In FIG. 1, a parity-check matrix of an LDPC code, composed of 4 rows and 8 columns, is considered. The matrix of FIG. 1 represents an LI)PC code for generating a length-8 codeword, as it has 8 columns. That is, the columns correspond to 8 coded bits. Although, the number of columns shown herein of length eight (8), it would be recognized by those skilled in the art that the number of columns may be increased or decreased without altering the scope of the invention.

FIG. 2 illustrates a graphical representation for a parity-check matrix $H_1$ of an LDPC code. That is, FIG. 2 is a diagram illustrating a Tanner graph corresponding to check matrix $H_1$ of FIG. 1. Referring to FIG. 2, the Tanner graph of the LDPC code is composed of 8 variable nodes $x_1$ (202), $x_2$ (204), $x_3$ (206), $x_4$ (208), $x_5$ (210), $x_6$ (212), $x_7$ (214) and $x_8$ (216), and 4 check nodes 218, 220, 222 and 224. Here, an $i^{th}$ column and a $j^{th}$ row of the parity-check matrix $H_1$ of the LDPC code corresponds to a variable node $x_i$ and a $j^{th}$ check node, respectively. A value of 1, or a non-zero value, at the point where an $i^{th}$ column and a $j^{th}$ row of the parity-check matrix $H_1$ of the LDPC code intersect infers that an edge exists between the variable node $x_i$ and the $j^{th}$ check node on the Tanner graph as shown in FIG. 2.

In the Tanner graph of the LDPC code, degrees of variable nodes and check nodes refers to the number of edges connected to the corresponding nodes, and the degree is equal to the number of non-zero entries in a column or row associated with the corresponding node in the parity-check matrix of the LDPC code. For example, in FIG. 2, degrees of the variable nodes $x_1$ (202), $x_2$ (204), $x_3$ (206), $x_4$ (208), $x_5$ (210), $x_6$ (212), $x_7$ (214) and $x_8$ (216) are 4, 3, 3, 3, 2, 2, 2 and 2, respectively, and degrees of the check nodes 218, 220, 222 and 224 are 6, 5, 5 and 5, respectively. In addition, the number of non-zero entries in the columns of the parity-check matrix $H_1$ of FIG. 1, corresponding to the variable nodes of FIG. 2, are coincident with the degrees 4, 3, 3, 3, 2, 2, 2 and 2 in that order, and the number of non-zero entries in the rows of the parity-check matrix $H_1$ of FIG. 1, corresponding to the check nodes of FIG. 2, are coincident with the degrees 6, 5, 5 and 5 in that order.

As described above, coded bits are in a one-to-one correspondence with columns of the parity-check matrix, and a one-to-one correspondence to variable nodes on the Tanner graph. In addition, degrees of variable nodes that in a one-to-one correspondence to the coded bits are referred to as degrees of coded bits.

For the LDPC code, it is known that higher-degree codeword bits are superior in decoding performance to lower-degree codeword bits. This is because compared with lower-degree variable nodes, higher-degree variable nodes acquire more information through iterative decoding, contributing to improvement of decoding performance.

The LDPC code has been described so far. A description will now be made of a signal constellation to which Quadrature Amplitude Modulation (QAM) is applied. QAM is a high-order modulation scheme commonly used in communication systems. A QAM-modulated symbol is composed of a real part and an imaginary part, and various modulation symbols can be formed by differentiating magnitude and sign of the real part and the imaginary part. To find out characteristics of QAM, QAM will be described together with Quadrature Phase Shift Keying (QPSK) modulation.

Figure 3A:
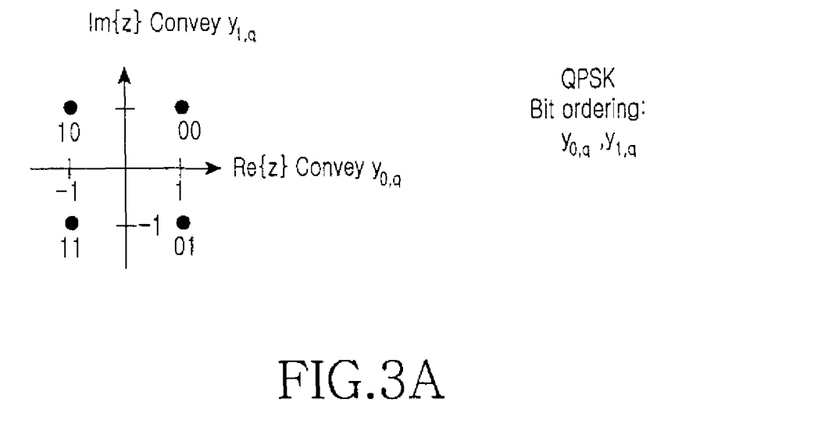
FIG. 3A is a schematic diagram of a conventional signal constellation for a general QPSK modulation scheme.

FIG. 3A is a schematic diagram of a signal constellation for a general QPSK modulation scheme. In the constellation, $y_0$ determines a sign of a real part, and $y_1$ determines a sign of an imaginary part. That is, when $y_0=0$, a sign of the real part is plus (+), and when $y_0=1$, a sign of the real part is minus (−). In addition, when $y_1=0$, a sign of the imaginary part is plus (+), and when $y_1=1$, a sign of the imaginary part is minus (−). Since $y_0$ and $y_1$ are sign indication bits indicating signs of the real part and the imaginary part, respectively, they are equal in error occurrence probability. Thus, for QPSK modulation, constituent bits of $(y_0, y_1)$ corresponding to one modulation signal are equal in reliability. For $y_{0,q}$ and $y_{1,q}$, the second index 'q' refers to a $q^{th}$ output of a modulation signal-constituting bit.

Figure 3B:
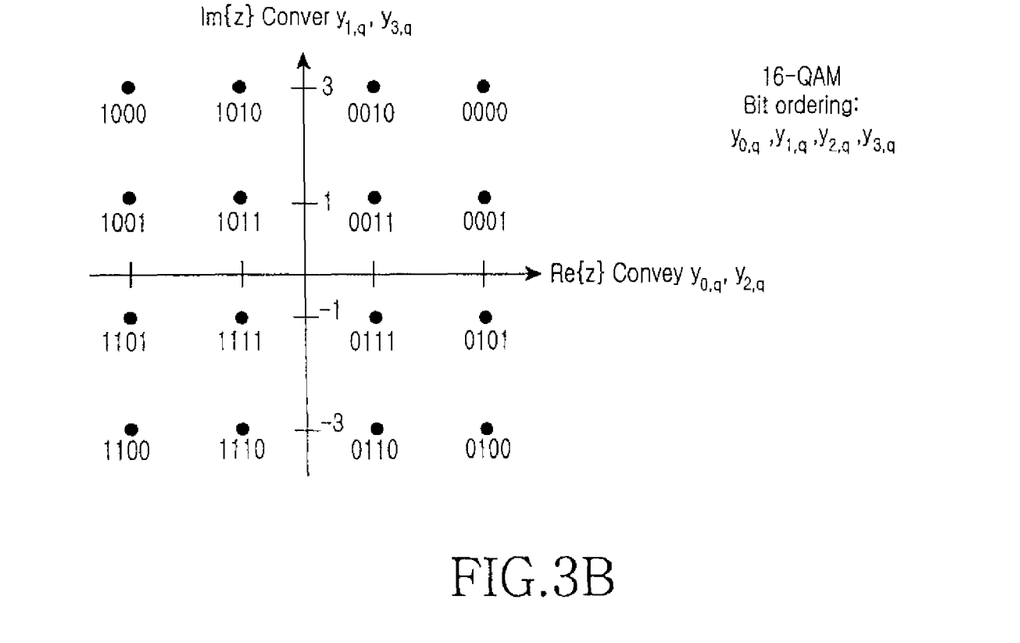
FIG. 3B is a schematic diagram of a conventional signal constellation for a general 16-QAM modulation scheme.

FIG. 3B is a schematic diagram of a signal constellation for a general 16-QAM modulation scheme. Constituent bits of $(y_0, y_1, y_2, y_3)$ corresponding to one modulation signal have the following definitions. Constituent bit $y_0$ and $y_2$ determine sign and magnitude of a real part, respectively, and constituent bit $y_1$ and $y_3$ determine sign and magnitude of an imaginary part, respectively. In other words, $y_0$ and $y_1$ determine signs of a real part and an imaginary part of a signal, and $y_2$ and $y_3$ determine magnitudes of a real part and an imaginary part of a signal. Since distinguishing sign of a modulated signal is easier than distinguishing magnitude, error occurrence probability for $y_2$ and $y_3$ is higher than error occurrence probability at $y_0$ and $y_1$. Therefore, no-error probabilities, or reliabilities, of constituent bits, are $R(y_0)=R(y_1)>R(y_2)R(y_3)$. Here, $R(y)$ represents reliability for a constituent bit $y_k$, where k=0-3. Unlike the QPSK modulation signal, the QAM modulation signal $(y_0, y_1, y_2, y_3)$ has a characteristic that constituent bits are different in reliability.

In 16-QAM modulation, wherein 4 bits constitute a signal, 2 bits determine signs of a real part and an imaginary part of the signal, and 2 bits only need to represent magnitudes of the real part and the imaginary part of the signal, so an order of $(y_0, y_1, y_2, y_3)$ and a role of each constituent bit are subject to change.

Figure 3C:
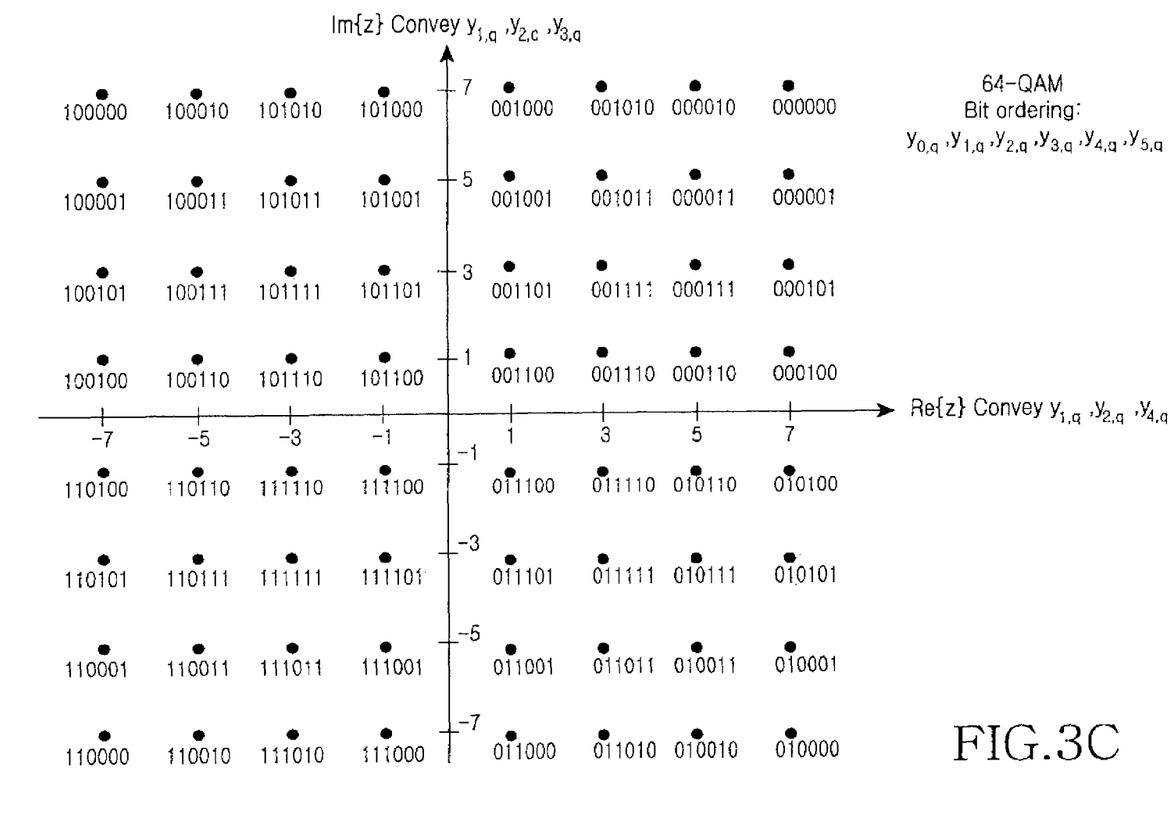
FIG. 3C is a schematic diagram of a conventional signal constellation for a general 64-QAM modulation scheme.

FIG. 3C is a schematic diagram of a signal constellation for a general 64-QAM modulation scheme. In this case, constituent bits of $(y_0, y_1, y_2, y_3, y_4, y_5)$ corresponding to one modulation signal, wherein bits $y_0$, $y_2$ and $y_4$ determine sign and magnitude of a real part, and bits $y_1$, $y_3$ and $y_5$ determine sign and magnitude of an imaginary part. Here, $y_0$ and $y_1$ determine signs of the real part and the imaginary part, respectively, and $y_2$, $y_3$, $y_4$ and $y_5$ determine magnitudes of the real part and the imaginary part, respectively. Since distinguishing sign of a modulated signal is easier than distinguishing magnitude, reliabilities of $y_0$ and $y_1$ are higher than reliabilities of $y_2$, $y_3$, $y_4$ and $y_5$. For example, $y_2$ and $y_3$ are determined according to whether magnitude of a modulated symbol is greater or less than 4, and $y_4$ and $y_5$ are determined according to whether magnitude of a modulated symbol is closer to 4 or 0, centering on 2, or determined according to whether magnitude of a modulated symbol is closer 4 or 8, centering on 6. Therefore, a determining range of $y_2$ and $y_3$ is 4, and a determining range of $y_4$ and $y_5$ is 2. Thus, reliabilities of $y_2$ and $y_3$ are higher than reliabilities of $y_4$ and $y_5$. In sum, no-error probabilities, or reliabilities, of constituent bits of a modulation signal are $R(y_0)=R(y_1)>R(y_2)=R(y_3)>R(y_4)=R(y_5)$.

In 64-QAM modulation, wherein 6 bits constitute a signal, 2 bits determine signs of a real part and an imaginary part of the signal, and 4 bits represent magnitudes of the real part and the imaginary part of the signal. Therefore, order of modulation signal $(y_0, y_1, y_2, y_3, y_4, y_5)$ and roles of the constituent bits are subject to change. Even for a signal constellation of 256-QAM or higher, roles and reliabilities of modulation signal-constituting bits are changed in the same manner as above. That is, if one modulation signal is defined as $(y_0, y_1, y_2, y_3, y_4, y_5, y_6, y_7)$, then $R(y_0)=R(y_1)>R(y_2)-R(y_3)>R(y_4)=R(y_5)>R(y_6)=R(y_7)$.

Conventionally, however, when the communication system using LDPC codes performs interleaving/deinterleaving, the system uses an arbitrary interleaving/deinterleaving scheme regardless of the LDPC code or reliability characteristics of constituent bits of a high-order modulation signal, or uses an interleaving/deinterleaving scheme where only degrees of variable nodes or check nodes of the LDPC code are considered, thereby failing to minimize distortion of signals transmitted over a channel. In addition, as reliabilities of two consecutive constituent bits $y_{2i}$ and $y_{2i+1}$ in a modulation signal are equal, the system recognizes the two bits as one bit group rather than recognizing them as two separate bits for a real part and an imaginary part. The limitation on recognition prevents maximization of the LDPC code's performance.

SUMMARY OF THE INVENTION

An aspect of the present invention provides a transmission/reception apparatus and method for reducing signal distortion in a communication system using an LDPC codeword.

Further, the present invention provides an interleaving apparatus and method for improving performance of an LDPC codeword in a communication system using an LDPC codeword.

Further, the present invention provides an apparatus and method for mapping modulation signal-constituting bits to improve performance of an LDPC codeword in a communication system using an LDPC codeword.

According to one aspect of the present invention, there is provided a method for transmitting data in a communication system using a Low Density Parity Check (LDPC) matrix.

The method includes generating an LDPC codeword by encoding information data bits, interleaving the LDPC codeword, mapping the interleaved LDPC codeword to a modulation signal, and generating a mapped signal by mapping the LDPC codeword bits separately to a bit corresponding to a real part and a bit corresponding to an imaginary part, among bits constituting the modulation signal, generating a modulation signal by high-order-modulating the mapped signal, and Radio Frequency (RF)-processing the modulation signal, and transmitting the RF-processed signal via a transmission antenna.

According to another aspect of the present invention, there is provided an apparatus for transmitting data in a communication system using a Low Density Parity Check (LDPC) matrix. The apparatus includes an encoder for encoding information data bits and outputting an LDPC codeword, an interleaver for interleaving the LDPC codeword, a bit mapper for mapping the interleaved LDPC codeword to a modulation signal, and outputting a mapped signal by mapping the LDPC codeword bits separately to a bit corresponding to a real part and a bit corresponding to an imaginary part, among bits constituting the modulation signal; a modulator for high-order-modulating the mapped signal, and outputting a modulation signal, and a Radio Frequency (RF) processor for RF-processing the modulation signal, and transmitting the RF-processed signal via a transmission antenna.

According to further another aspect of the present invention, a method for receiving data in a communication system using a Low Density Parity Check (LDPC) matrix includes: Radio Frequency (RF)-processing a signal received through a reception antenna, generating a demodulation signal by demodulating the RF-processed signal, demapping an LDPC codeword mapped to the demodulation signal, and generating a demapped signal by demapping the LDPC codeword bits separately to a bit corresponding to a real part and a bit corresponding to an imaginary part among the bits constituting the demodulation signal; deinterleaving the demapped LDPC codeword and decoding the deinterleaved LDPC codeword.

According to yet another aspect of the present invention, an apparatus for receiving data in a communication system using a Low Density Parity Check (LDPC) matrix includes a Radio Frequency (RF) processor for RF-processing a signal received through a reception antenna, a demodulator for demodulating the RF-processed signal and outputting a demodulation signal, a bit demapper for demapping an LDPC codeword mapped to the demodulation signal, and outputting a demapped signal by demapping the LDPC codeword bits separately to a bit corresponding to a real part and a bit corresponding to an imaginary part among the bits constituting the demodulation signal, a deinterleaver for deinterleaving the bit-demapped LDPC codeword and a decoder for decoding the deinterleaved LDPC codeword.

BRIEF DESCRIPTION OF THE DRAWINGS

The above and other aspects, features and advantages of the present invention will become more apparent from the following detailed description when taken in conjunction with the accompanying drawings in which.

DETAILED DESCRIPTION OF THE INVENTION

Embodiments of the present invention are now described in detail with reference to the accompanying drawings. In the following description, a detailed description of known functions and configurations incorporated herein has been omitted for clarity and conciseness. Terms used herein are defined based on functions in the present invention and may vary according to users, operators' intention or usual practices. Therefore, the definition of the terms should be made based on contents throughout the specification.

Figure 4:
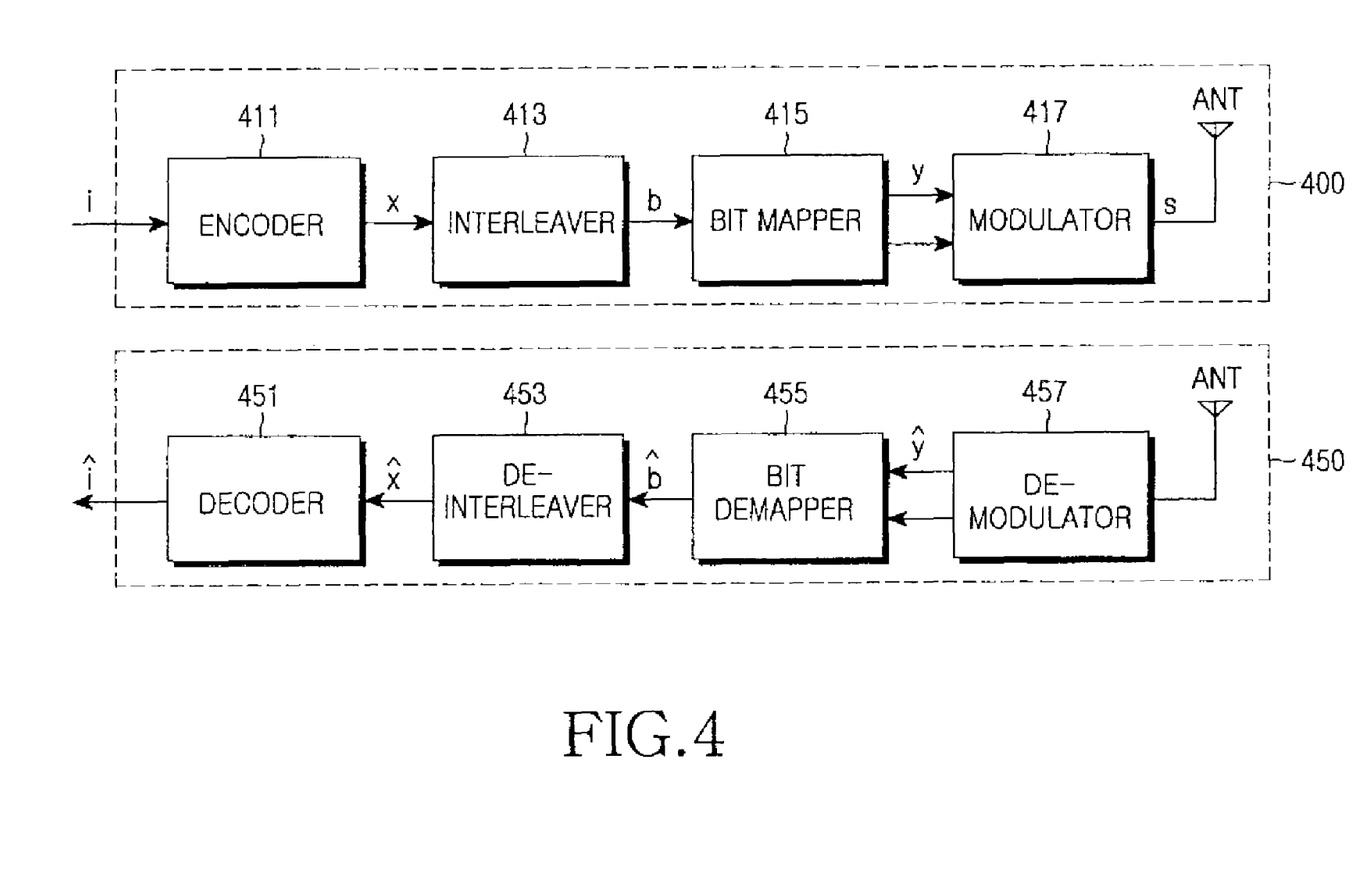
FIG. 4 is a diagram illustrating a structure of a communication system using an LDPC code according to an embodiment of the present invention.

FIG. 4 is a block diagram illustrating a structure of a communication system using an LDPC code according to an embodiment of the present invention. With reference to FIG. 4, a description will now be made of a structure of a communication system using an LDPC code according to an embodiment of the present invention.

A transmitter 400 according to the present invention includes an encoder 411, an interleaver 413, a bit mapping into constellation or signal constellation bit mapper (hereinafter 'bit mapper' for short) 415, and a modulator 417.

A receiver 450 according to the present invention includes a demodulator 457, a signal constellation bit demapper (hereinafter 'bit demapper' for short) 455, a deinterleaver 453, and a decoder 451.

After operations of a transmitter and a receiver of the present invention are first described in brief with reference to FIG. 4, more detailed information regarding structures and operations of interleaver 413 and bit mapper 415 of the present invention will be described with reference to FIG. 5.

According, in the communication system shown in FIG. 4, when an information data bit stream i is input to the transmitter 400, the encoder 411 encodes the information data bit stream i using a predetermined scheme, and generates a codeword x. The codeword x represents and encoding of the data bit stream either with an error coding code type code or an encryption type code or combinations thereof As the encoder 411 is an LDPC encoder, the codeword generated by the encoder 411 is an LDPC codeword of the input data bit stream i or a representation thereof.

The interleaver 413 interleaves the LDPC codeword x output from the encoder 411 using a predetermined scheme, and outputs an interleaved LDPC codeword b. An interleaving operation of the interleaver 413 is performed according to an interleaving scheme as described in further detail below.

The bit mapper 415 performs signal constellation bit mapping on the bits output from the interleaver 413, i.e., the interleaved LDPC codeword b, using a predetermined scheme. The bit mapper 415 performs mapping according to a mapping scheme in accordance with the principles of the present invention. The mapping scheme maps input bits to bits constituting a modulation symbol according to a degree characteristic of the LDPC codeword b, as is described in further detail below.

The modulator 417 modulates the signal output from the bit mapper 415 using a predetermined scheme, and transmits the modulated signal via a transmission antenna (.ANT).

The interleaver 413 and the bit mapper 415 of the present invention perform interleaving and bit mapping so as to minimize a Bit Error Rate (BER) or a codeword error rate (or Frame Error Rate (FER)) when the modulator 417 modulates the interleaved LDPC codeword b, thereby increasing the performance.

Herein, the interleaver 413 and the bit mapper 415 are designed in such a manner that a relationship between codeword bits, which are an input signal to an interleaver, and modulation signal-constituting bits, which are an output signal of the bit mapper, satisfies the following rules. For purposes of illustrating the rules described herein, it is assumed that the number of bits of an LDPC codeword is N and 256-QAM modulation is used. However, it would be understood by those skilled in the art that the modulation scheme may be changed without altering the scope of the invention.

In accordance with the principles of the invention, the LDPC codewords are ordered in descending order of degree, and divided into a plurality of groups. In this illustrated example, the number of groups is chosen as 8. But it would be recognized that this number may be increased or decreased without changing the scope of the invention. Thus, the LDPC codewords can be expressed such that codeword $c=[G_0, G_1, G_2, G_3, G_4, G_5, G_6, G_7]$, where $G_0=[c_1\ c_2\ c_3\ \ldots\ c_{N/8}]$, $G_1=[c_{N/8+1}\ c_{N/8+2}\ c_{N/8+3}\ \ldots\ c_{2N/8}]$, and $G_7=[c_{7N/8+1}\ c_{7N/8+2}\ c_{7N/8+3}\ \ldots\ c_N]$.

Rule 1) maps those bits belonging to the highest-degree group $G_0$ among the LDPC codeword bits to the highest-reliability bit $y_0$ or $y_1$ among the modulation signal-constituting bits.

Rule 2) maps those N/8 bits belonging to $G_1$ among the LDPC codeword bits to the medium-reliability bit $y_5$ or $y_4$ among the modulation signal-constituting bits.

Rule 3) maps those N/8 bits belonging to $G_2$ among the LDPC codeword bits to the lowest-reliability bit $y_0$ or $y_7$ among the modulation signal-constituting bits.

Rule 4) maps those N/8 bits belonging to $G_3$ among the LDPC codeword bits to the lowest-reliability bit $y_7$ or $y_6$ among the modulation signal-constituting bits. If the LDPC codeword bits belonging to $G_2$ are mapped to $y_6$ in Rule 3), Rule 4) maps the LDPC codeword bits belonging to $G_3$ to $y_7$, and if the LDPC codeword bits belonging to $G_2$ are mapped to $y_7$ in Rule 3), the LDPC codeword bits belonging to $G_3$ are mapped to $y_6$.

Rule 5) maps bits belonging to the remaining groups ($G_4$, $G_5$, $G_6$ and $G_7$) among the LDPC codeword bits to modulation signal-constituting bits which are not mapped to $G_0$, $G_1$, $G_2$ and $G_3$ by Rule 1) to Rule 4).

A detailed description will now be made of methods in which bits are mapped according to the above rules.

An example of Rule 1) maps N/8 bits corresponding to $[c_1\ c_2\ c_3\ \ldots\ c_{N/8}]$ in a codeword $c=[c_1\ c_2\ c_3\ \ldots\ c_N]$ which are ordered in descending order of degree, to the highest-reliability bits among the modulation signal-constituting bits. For example, the N/8 bits are mapped to the highest-reliability bits $y_0$ in a modulation signal-constituting symbol.

An example of Rule 2) maps N/8 bits corresponding to $c=[c_{N/8+1}\ c_{N/8+2}\ c_{N/8+3}\ \ldots\ c_{2N/8}]$ to the medium-reliability bits among the modulation signal-constituting bits. For example, the N/8 bits are mapped to bits $y_5$ when 256 QAM is used as a modulation scheme.

An example of Rule 3) maps N/8 bits corresponding to $c=[c_{2N/8+1}\ c_{2N/8+2}\ c_{2N/8+3}\ \ldots\ c_{3N/8}]$ to the lowest-reliability bits among the modulation signal-constituting bits. For example, the N/8 bits are mapped to bits $y_6$ when 256 QAM is used as a modulation scheme.

An example of Rule 4) maps N/8 bits corresponding to $c=[c_{3N/8+1}\ c_{3N/8+2}\ c_{3N/8+3}\ \ldots\ c_{4N/8}]$ to the lowest-reliability bits among the modulation signal-constituting bits. For example, the N/8 bits are mapped to bits $y_7$ when 256 QAM is used as a modulation scheme.

When the relationship between the LDPC codeword bits and the modulation signal-constituting bits is established as stated above, it is possible to improve decoding performance of the LDPC codeword. Compared to the existing scheme, the key feature of the above rules is to divide more than two bits constituting a modulation signal into a real part and an imaginary part even though they are equal in reliability, regarding them as different bits.

Although the conventional art finds an excellent mapping method by simply distinguishing only the error correction capabilities based on degrees and the reliabilities based on modulation signal-constituting bits, the present invention includes a mapping method by subdividing even the bits having the same reliability into a real part and an imaginary part. The reason why the mapping scheme to which the above rules are applied can obtain superior performance will be described in detail below.

In the LDPC codeword, the higher-degree bits can obtain superior performance compared with the lower-degree bits. Thus, even though the higher-degree bits are mapped to the modulation signal-constituting bits having lower reliability, they can be sufficiently restored to the original signal in the decoding process. However, when a ratio of higher-degree bits among the codeword bits is higher, influence of the higher-degree bits increases in the decoding process. Thus, as many higher-degree bits are mapped to lower-reliability bits, the influencing power of the lower-reliability bits increases undesirably. Therefore, properly mixed-mapping modulation signal-constituting bits having higher reliability and modulation signal-constituting bits having lower reliability to higher-degree coded bits contributes to performance improvement rather than mapping modulation signal-constituting bits having lower reliability to all higher-degree coded bits.

Further, as for lower-degree bits in the LDPC codeword, their performance can be improved by mapping the lower-degree bits to modulation signal-constituting bits that have higher reliability though their error correction capability is lower in the decoding process. However, if all of the lower-degree codeword bits are mapped to the higher-reliability modulation signal-constituting bits, all higher-degree codeword bits are mapped to lower-reliability modulation signal-constituting bits, causing an increase in influencing power of the lower-reliability bits. Further, if only the lower-reliability modulation signal-constituting bits are mapped to the lower-degree codeword bits, error correction capability of the lower-degree codeword bits suffers significant degradation, causing an error floor. Preferably, therefore, the lower-degree codeword bits are mapped to medium-reliability modulation signal-constituting bits.

In order to obtain high quality performance when the mapping is performed as stated above, the mapping method can be properly applied when the number of higher-degree codeword bits is relatively large.

Meanwhile, the receiver 450 receives the signal transmitted from the transmitter 400, and outputs a signal through a reverse process of the transmitter 400. That is, a signal received at the receiver 450 through a reception antenna ANT, is delivered to the demodulator 457. The demodulator 457 demodulates the received signal using a demodulation scheme corresponding to the modulation scheme of the modulator 417 in the transmitter 400, and outputs the demodulated signal to the bit demapper 455. The bit demapper 455 bit-demaps the signal output from the demodulator 457 according to the mapping scheme carried out in the bit mapper 415 of the transmitter 400, and then outputs the resulting signal to the deinterleaver 453. The deinterleaver 453 deinterleaves the signal output from the bit demapper 455 according to the interleaving scheme applied by the interleaver 413 in the transmitter 400, and outputs the resulting signal to the decoder 451. The decoder 451 decodes the deinterleaved signal using a decoding scheme corresponding to the coding scheme applied in the encoder 411 of the transmitter 400, restoring the final information data bits.

Meanwhile, in FIG. 4, the signal output from the modulator 417 is transmitted via the transmission antenna after undergoing Radio Frequency (RF) processing in a separate RF transmitter (not shown) for RF signal transmission processing. Similarly, the signal received at the reception antenna is input to the demodulator 457 after undergoing RF processing in an RF receiver (not shown) for RF signal reception processing.

The transmitter of the present invention is featured by the interleaver 413 and the bit mapper 415 that use the unequal reliability characteristics of the high-order modulation scheme, and the receiver of the present invention is featured by the deinterleaver 453 and the bit demapper 455 that use the unequal reliability characteristics of the high-order modulation scheme.

Figure 5:
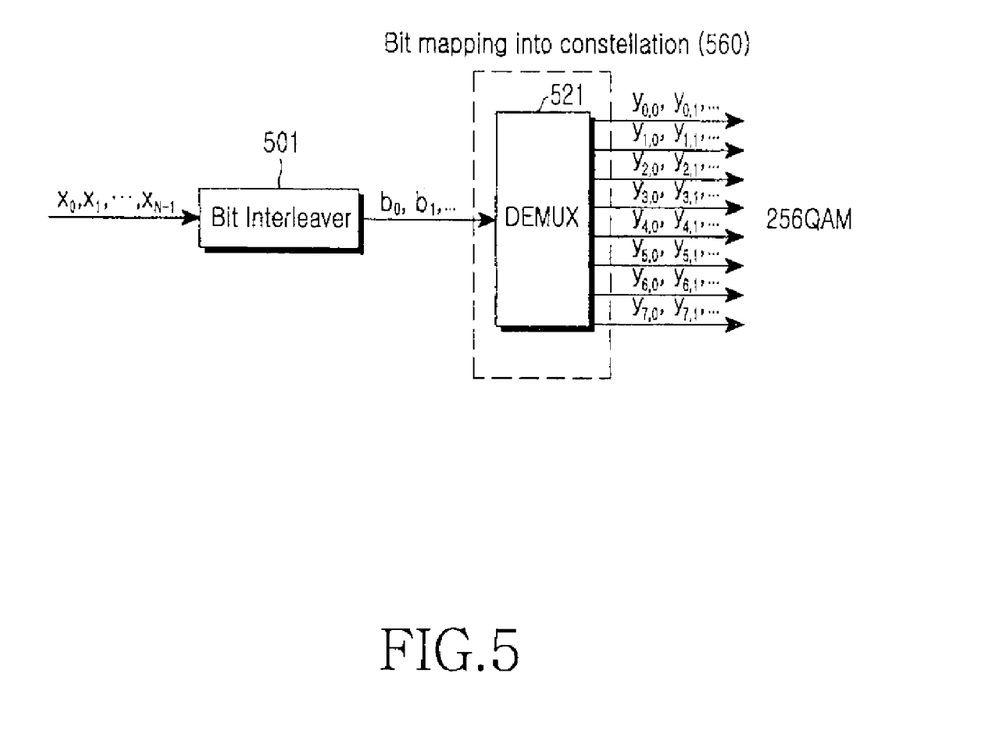
FIG. 5 is a diagram illustrating structures of an interleaver and a bit mapper according to an embodiment of the present invention.

With reference to FIG. 5, a detailed description will now be made of the operation of an interleaver and a bit mapper in accordance with the principles of the present invention. FIG. 5 is a block diagram illustrating structures of an interleaver and a bit mapper according to an embodiment of the present invention.

As illustrated in FIG. 5, the bit mapper 415 of FIG. 4 is comprised of a demultiplexer (DEMUX) 521. The mapping scheme shown in FIG. 5 uses 256-QAM modulation signals.

When a coded signal x is input to an interleaver 501, the interleaver 501 interleaves the coded signal, and outputs a signal b. The interleaved signal b is input to the demultiplexer 521 where it is separated into a plurality of streams. That is, for 256-QAM, the interleaved signal b is separated into 8 streams, for example. In other words, the signals received through the structure of FIG. 5 are demultiplexed into a plurality of streams after being interleaved according to the corresponding modulation scheme.

The demultiplexer 521 generates modulation signal-constituting bits by separating a received stream ($b_0, b_1, b_2 \ldots$) into a plurality of streams, and in the present invention, determining which of the modulation signal-constituting bits the interleaved codeword bits constitute is important. First, LDPC codeword bits $x_0, x_1, \ldots, x_{N-2}, x_{N-1}$ are input to the interleaver 501. An interleaving scheme is determined taking into account all of a bit mapping scheme for each modulation signal, degree distribution for each bit of the LDPC code, and reliability for each bit of the signal constellation. A detailed description thereof will be given below.

Output bits $b_0, b_1, \ldots b_{N-2}, b_{N-1}$ of the interleaver 501 are input to the demultiplexer 521 where they are demultiplexed into bits constituting a modulation signal. That is, for 256-QAM, since a modulation signal is composed of 8 bits, input bits of the demultiplexer 521 are demultiplexed into 8 bits. Here, the bit mapping method is determined according to the mapping relation between the consecutively-received 8 bits $b_0, b_1, b_2, b_3, b_4, b_5, b_6, b_7$ and the bits $y_0, y_1, y_2, y_3, y_4, y_5, y_6, y_7$ constituting a signal. A detailed description will now be made of an interleaving scheme and a bit mapping method according to the present invention. The interleaver and bit mapper proposed by the present invention are designed by the above-stated rules.

It can be understood in FIG. 5 that $y_0, y_2, y_4, y_6$ among the modulation signal-constituting bits $y_0, y_1, y_2, y_3, y_4, y_5, y_6, y_7$ which are an output signal of the demultiplexer 521, constitute a real part, and $y_1, y_3, y_5, y_7$ constitute an imaginary part. A description will now be made of a design process for an interleaver according to an embodiment of the present invention. The design process for an interleaver according to the present invention follows the following steps.

Step 1: The number of columns of an interleaver is determined so that it is equal to the number of bits used in a modulation symbol, i.e., the number of modulation signal-constituting bits.

Step 2: A value determined by dividing a length of a codeword by the number of columns, determined in Step 1, is determined as the number of interleave rows.

Step 3: LDPC codeword bits are written in the size-determined interleaver column by column.

Step 4: One bit is read from each column in which codeword bits are written.

Table 1 shows sizes of rows and columns of an interleaver based on each modulation scheme for the exemplary cases where a length of the codeword is 16200 and 64800.

TABLE 1

| Modulation | Number of rows | | Number of columns |
|---|---|---|---|
| | N = 648000 | N = 162000 | |
| QPSK | 324000 | 8100 | 2 |
| 16QAM | 162000 | 4050 | 4 |
| 64QAM | 108000 | 2700 | 6 |
| 256QAM | 8100 | 2025 | 8 |

Figure 6A:
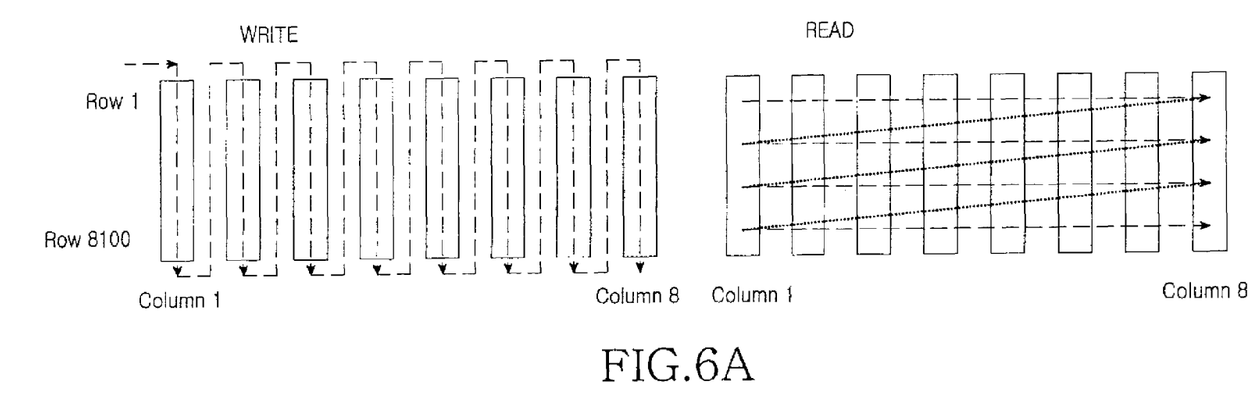
FIGS. 6A and 6B are diagrams illustrating an operation of an interleaver according to an embodiment of the present invention.
Figure 6B:
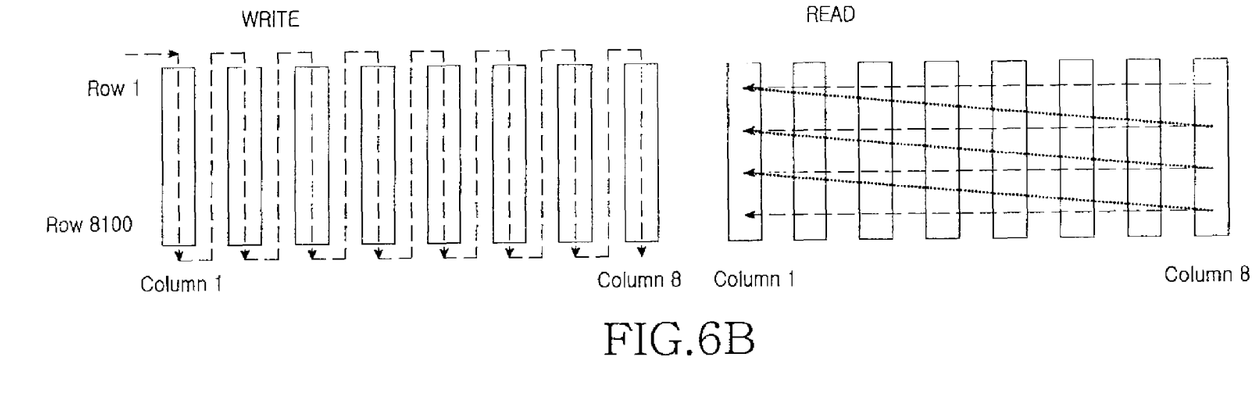

With reference to FIGS. 6A and 6B, a description will now be made of design and operation of the interleaver, with regard to a particular modulation scheme. In the following description, it is assumed that an LDPC matrix is sequentially ordered in the order of higher-degree rows. The reason for this ordering has been previously described above, as a degree of a codeword bit corresponding to a variable node of the LDPC matrix is higher, the decoding performance is superior. Therefore, corresponding bits of a codeword generated considering the descending-ordered LDPC matrix are also descending-ordered, and the descending-ordered codeword bits refers to an order of decoding performance of the bits.

FIGS. 6A and 6B are diagrams illustrating an operation of an interleaver according to an embodiment of the present invention. It is assumed that the interleaver of FIGS. 6A and 6B uses 256-QAM modulation and a length of an LDPC codeword is 64800. Design and operation of the interleaver will be described according to 4 steps.

Referring to step 1, 8 columns are formed, the number of which is equal to the number of modulation signal-constituting bits used in 256-QAM. In Step 2, the number of interleave rows are determined as 64800/8=8100. In Step 3, LDPC codeword bits are sequentially written in each column. When the writing in each column is completed, writing in the next column is carried out as shown in the drawings. In this case, the number of bits written in each column is 8100, which is the number of rows, calculated above. In Step 4, bits are sequentially read from each column one by one. In FIG. 6A, bits are sequentially read from the first bit of a column number 1 to the first bit of a column number 8, and then, bits are sequentially read from the second bit of the column number 1 to the second bit of the column number 8. This process is repeated 8100 times, which is equal to the number of interleave rows.

Through the above process, the LDPC codeword is interleaved. In addition, in order to additionally increase interleaving performance, arbitrary interleaving can be performed even within each column. If there is correlation between adjacent codeword bits, they can undergo interleaving to be more robust against a burst error.

The interleaving scheme has been described so far. A description will now be made of a bit mapping scheme proposed by the present invention. The bit mapping scheme described below maps the highest-degree codeword bit to one of the highest-reliability bits among modulation signal-constituting bits, based on reading of one row during interleaving reading of an LDPC codeword, and then, maps the second highest-degree codeword bit to one of the lower-reliability bits among the modulation signal-constituting bits, thereby minimizing the total BER.

Of the output values of the interleaver described in FIGS. 6A and 6B, codeword bits read from a column number 1 are allocated to the highest-reliability bits among the modulation signal-constituting bits, and codeword bits read from a column #3 and a column #4 are allocated to a lowest reliability bits among the modulation signal-constituting bits. When an interleaver is considered that sequentially reads bits from the bit of the column number 1 to the bit of the column number 8 as shown in FIG. 6A, (right side) an embodiment of the scheme in which output bits of the interleaver are allocated to modulation signal-constituting bits according to 256 QAM modulation, is illustrated in Table 2.

TABLE 2

| <256 QAM - Method 1> | $b_{8k+0}$ mapped to $y_{0,k}$ |
| --- | --- |
| | $b_{8k+1}$ mapped to $y_{5,k}$ |
| | $b_{8k+2}$ mapped to $y_{6,k}$ |
| | $b_{8k+3}$ mapped to $y_{7,k}$ |
| | $b_{8k+4}$ mapped to $y_{1,k}$ |
| | $b_{8k+5}$ mapped to $y_{4,k}$ |
| | $b_{8k+6}$ mapped to $y_{2,k}$ |
| | $b_{8k+7}$ mapped to $y_{3,k}$ |
| <256 QAM - Method 2> | $b_{8k+0}$ mapped to $y_{0,k}$ |
| | $b_{8k+1}$ mapped to $y_{5,k}$ |
| | $b_{8k+2}$ mapped to $y_{6,k}$ |
| | $b_{8k+3}$ mapped to $y_{7,k}$ |
| | $b_{8k+4}$ mapped to $y_{1,k}$ |
| | $b_{8k+5}$ mapped to $y_{2,k}$ |
| | $b_{8k+6}$ mapped to $y_{4,k}$ |
| | $b_{8k+7}$ mapped to $y_{3,k}$ |

In the above, when the number of codeword bits is N, output bits of the interleaver are expressed as $b=b_0, b_1, b_2, b_3, b_4, b_5, b_6, \ldots, b_N$. In addition, $k^{th}$ read modulation signal-constituting bits among the modulation signal-constituting bits are represented as $y_{0,k}$. For 256 QAM, the $k^{th}$ read modulation signal-constituting bits are expressed as ($y_{0,k}, y_{1,k}, y_{2,k}, y_{3,k}, y_{4,k}, y_{5,k}, y_{6,k}, y_{7,k}$), where k=0, 1, . . . , N/8-1.

It can be understood from Table 2 that the bits corresponding to $b_0$ to $b_7$ satisfy all of Rules 1-4, recited above. In 256 QAM of Table 2, a modulation signal is composed of 8 bits, the number of the highest-reliability modulation signal-constituting bits is 2, the medium-reliability modulation signal-constituting bits is 4, and the lowest-reliability modulation signal-constituting bits is 2. Therefore, for 256 QAM, there are various possible interleavers that can be constructed according to the design rules of the present invention. That is, modifications of interleavers, that are conceptually equal to the two methods (i.e., <256 QAM—Method 1> and <256 QAM—Method 2>) shown in Table 2 are shown in Table 3.

TABLE 3

| <256 QAM - Method 1, Modification> | $b_{8k+0}$ mapped to $y_{1,k}$ |
| --- | --- |
| | $b_{8k+1}$ mapped to $y_{4,k}$ |
| | $b_{8k+2}$ mapped to $y_{7,k}$ |
| | $b_{8k+3}$ mapped to $y_{6,k}$ |
| | $b_{8k+4}$ mapped to $y_{0,k}$ |
| | $b_{8k+5}$ mapped to $y_{5,k}$ |
| | $b_{8k+6}$ mapped to $y_{3,k}$ |
| | $b_{8k+7}$ mapped to $y_{2,k}$ |
| <256 QAM - Method 2, Modification> | $b_{8k+0}$ mapped to $y_{1,k}$ |
| | $b_{8k+1}$ mapped to $y_{4,k}$ |
| | $b_{8k+2}$ mapped to $y_{7,k}$ |
| | $b_{8k+3}$ mapped to $y_{6,k}$ |
| | $b_{8k+4}$ mapped to $y_{0,k}$ |
| | $b_{8k+5}$ mapped to $y_{3,k}$ |
| | $b_{8k+6}$ mapped to $y_{5,k}$ |
| | $b_{8k+7}$ mapped to $y_{2,k}$ |

For a better understanding, writing/reading of a signal according to the interleaving and bit mapping scheme according to the present invention will be described with reference to FIGS. 7A and 7B.

Figure 7A:
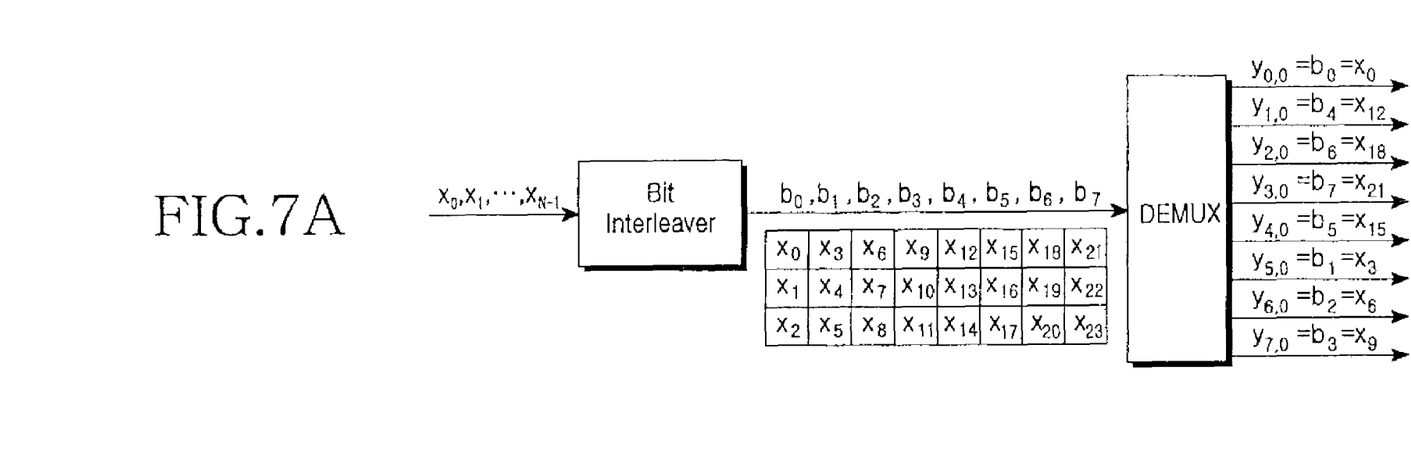
FIGS. 7A and 7B are diagrams illustrating interleaving and bit mapping method according to an embodiment of the present invention.
Figure 7B:
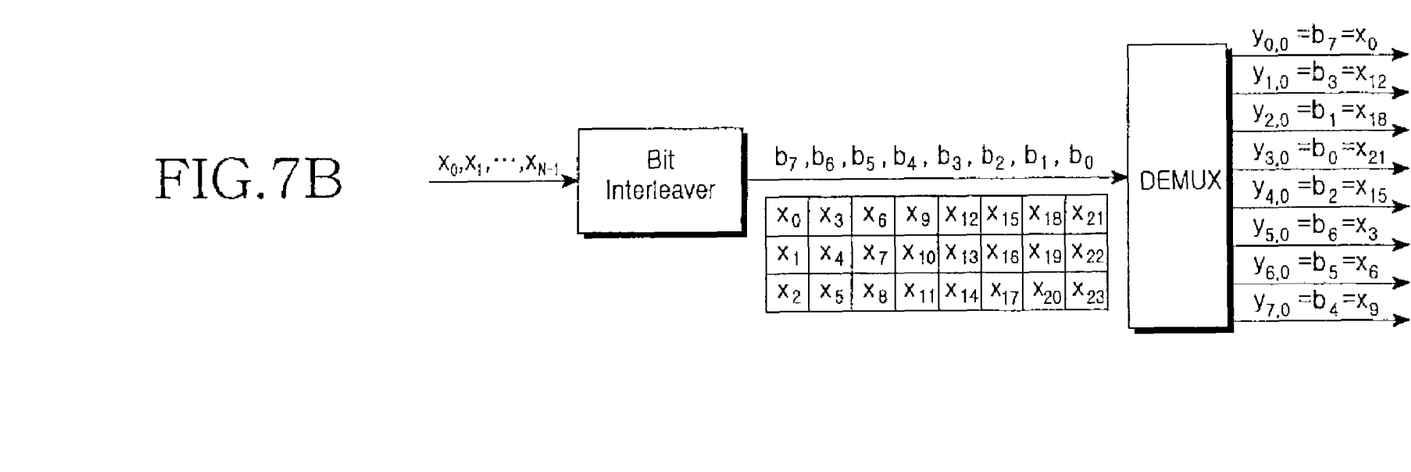

FIGS. 7A and 7B are illustrate interleaving and bit mapping method according to another embodiment of the present invention. For purposes of illustrating this embodiment of the invention, a modulation scheme is selected as being 256-QAM and a length of a codeword is 24 bits, a size of columns of the interleaver is selected as 8, and a size of rows is selected as 3. Assuming that the bit mapping method is similar to one described in Table 2, (i.e., <256 QAM—Method 1>).i.

A codeword output from an LDPC encoder is represented as $x=[x_0, x_1, x_2, x_3, x_4, x_5, x_6, x_7, x_8, x_9, x_{10}, x_{11}, x_{12}, x_{13}, x_{14}, x_{15}, x_{16}, x_{17}, x_{18}, x_{19}, x_{20}, x_{21}, x_{22}, x_{23}]$, and degrees of codeword bits are [8, 8, 8, 8, 8, 3, 3, 3, 3, 3, 3, 3, 2, 2, 2, 2, 2, 2, 2, 2, 2, 2, 2, 2]. When the codeword bits are written in the interleaver 501 column by column, $x_0, x_1, x_2$ are written in a column #1; $x_3, x_4, x_5$ are written in a column #2; $x_6, x_7, x_9$ are written in a column #3; $x_9, x_{10}, x_{11}$ are written in a column #4; $x_{12}, x_{13}, x_{14}$ are written in a column #5; $x_{15}, x_{16}, x_{17}$ are written in a column #6; $x_{18}, x_{19}, x_{20}$ are written in a column #7; and $x_{21}, x_{22}, x_{23}$ are written in a column #8. Bits read from each of the columns row by row, i.e., a signal being output after undergoing interleaving, are $b=[b_0, b_1, b_2, b_3, b_4, b_5, b_6, b_7]=[x_0, x_3, x_6, x_9, x_{12}, x_{15}, x_{18}, x_{21}]$.

When b is input to the demultiplexer 521, since it is subjected to mapping according to the mapping rule, $y=y_{0,0}, y_{1,0}, y_{2,0}, y_{3,0}, y_{4,0}, y_{5,0}, y_{6,0}, y_{7,0}=b_0, b_4, b_6, b_7, b_5, b_1, b_2, b_3=x_0, x_{12}, x_{18}, x_{21}, x_{15}, x_3, x_6, x_9$. That is, the codeword bits mapped to the highest-reliability sign-determining bits $y_{0,0}$ and $y_{1,0}$ are $x_0$ and $x_{12}$. In addition, the codeword bits mapped to the lowest-reliability magnitude-determining bits $y_{6,0}$ and $y_{7,0}$ are $x_6$ and $x_9$.

In the interleaving and bit mapping scheme described up to now, outputs of the interleaver 501 are read in the direction of a column number 1 to a column number 8, and subjected to bit mapping according thereto. Such interleaving scheme and bit mapping scheme are defined as 'forward interleaving' and 'forward bit mapping', respectively. Although the forward direction is defined herein as a direction from the column number 1 to the column number 8, the forward direction can be defined as a direction from the column number 8 to the column number 1, when necessary.

However, it is not always that the interleaver 501 should read codeword bits in the forward direction as shown in FIG. 6A. Therefore, if the interleaver 501 reads codeword bits in the order shown FIG. 6B, i.e., in the opposite direction of FIG. 6A, (right side) or reverse direction, a mapping scheme of a bit mapper 560 can be changed to the schemes shown in Table 4. Such schemes are defined as 'reverse interleaving' and 'reverse bit mapping'.

TABLE 4

| | |
|---|---|
| <256 QAM Method 1, Modification 2> | $b_{8k+0}$ mapped to $y_{3,k}$ |
| | $b_{8k+1}$ mapped to $y_{2,k}$ |
| | $b_{8k+2}$ mapped to $y_{4,k}$ |
| | $b_{8k+3}$ mapped to $y_{1,k}$ |
| | $b_{8k+4}$ mapped to $y_{7,k}$ |
| | $b_{8k+5}$ mapped to $y_{6,k}$ |
| | $b_{8k+6}$ mapped to $y_{5,k}$ |
| | $b_{8k+7}$ mapped to $y_{0,k}$ |
| <256 QAM - Method 2, Modification 2> | $b_{8k+0}$ mapped to $y_{3,k}$ |
| | $b_{8k+1}$ mapped to $y_{4,k}$ |
| | $b_{8k+2}$ mapped to $y_{2,k}$ |
| | $b_{8k+3}$ mapped to $y_{1,k}$ |
| | $b_{8k+4}$ mapped to $y_{7,k}$ |
| | $b_{8k+5}$ mapped to $y_{6,k}$ |
| | $b_{8k+6}$ mapped to $y_{5,k}$ |
| | $b_{8k+7}$ mapped to $y_{0,k}$ |

An example of mapping by the reverse bit mapping scheme according to the reverse interleaving shown in FIG. 6B is shown in FIG. 7B.

Outputs of FIG. 7B are as follows.

$$y = y_{0,0}, y_{1,0}, y_{2,0}, y_{3,0}, y_{4,0}, y_{5,0}, y_{6,0}, y_{7,0}$$
$$= b_7, b_3, b_1, b_0, b_2, b_6, b_5, b_4$$
$$= x_0, x_{12}, x_{18}, x_{21}, x_{15}, x_3, x_6, x_9$$

In the present invention, a bit mapper composed of an interleaver and a demultiplexer is illustrated and referred to in describing the processing herein. However, the mapper and interleaver, rather than being realized by hardware, can be realized by software like in the case wherein the interleaver based on the above mapping scheme is stored in a memory. In some cases, the bit mapper can be realized with a scheme of directly mapping the codeword bits to the modulation signal-constituting bits.

A description will now be made of performance improvement during data transmission by the interleaving and bit mapping scheme of the present invention.

Figure 8:
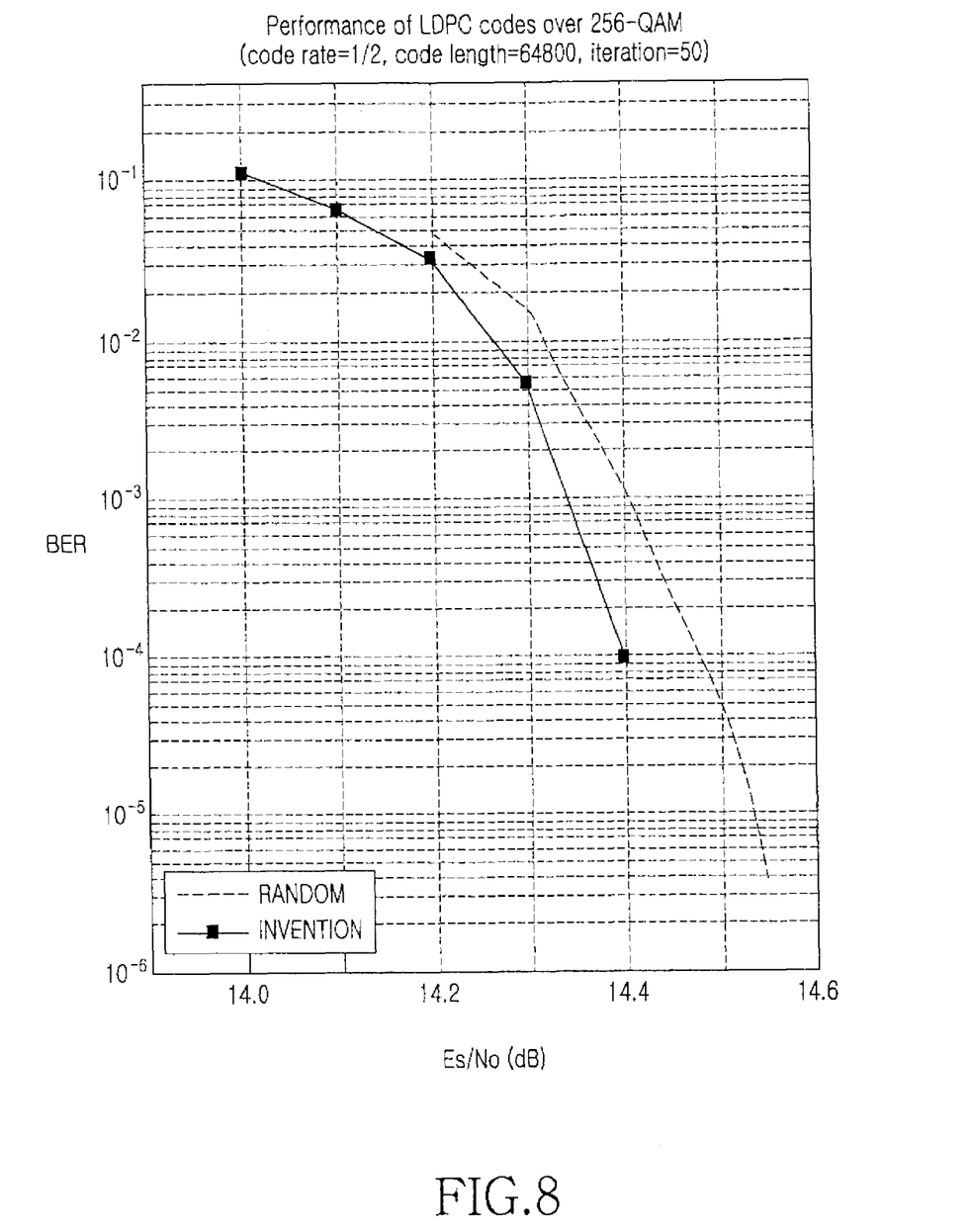
FIG. 8 is a diagram illustrating performance improvement based on a data transmission scheme according to an embodiment of the present invention.

FIG. 8 is a diagram illustrating performance improvement based on a data transmission scheme according to an embodiment of the present invention. Shown in FIG. 8 is BER for an LDPC codeword with length=64800. The simulation results were obtained in the AWGN channel when a 256-QAM modulation signal was used. The dotted line represents FER of an interleaver designed using a random scheme, and the solid line represents FER when an interleaver and bit mapping scheme according to the present invention are used. It can be appreciated that the present invention can obtain performance gain of about 0.08 dB at BER=0.0001.

Referring back to FIG. 4, the interleaving scheme and bit mapping scheme in the transmitter 400 have been described so far. A description will now be made of the deinterleaving and bit demapping scheme used in the receiver 450. Since it would be obvious to those skilled in the art that the receiver 450 corresponds to the transmitter 400 in structure, a brief description of the de-interleaving scheme and de-bit-mapping scheme will thus be presented. That is, the demodulator 457 in the receiver 450 performs high-order demodulation on the received signal, and outputs modulation signal-constituting bits, and the signal constellation bit de-mapper 455 bit-de-maps the output modulation signal-constituting bits, and outputs a de-mapped signal. A de-mapping method used in this case corresponds to the bit mapping scheme of the transmitter 400. That is, the de-mapping method de-maps two higher-reliability bits among the modulation signal-constituting bits to a higher-degree LDPC codeword bit and a lower-degree LDPC codeword, and de-maps two lower-reliability bits to a higher-degree LDPC codeword and a lower-degree LDPC codeword bit. Since the bit de-mapper 455 corresponds to the bit mapper 415 in the transmitter 400, the bit de-mapper 455 is formed of a multiplexer (not shown).

The bit-de-mapped output signal is input to the deinterleaver 453. A size of the deinterleaver 453 is equal to the size of the interleaver 413 in the transmitter 400. If the bit-demapped signals are sequentially written in the deinterleaver 453 row by row, and they are read in the forward direction (read beginning from a row number 1) column by column, the deinterleaved LDPC codeword bits are output. The output LDPC codewords are input to the decoder 451 where they are decoded. If interleaving of the transmitter 400 is reverse interleaving, deinterleaving of the receiver is also reverse deinterleaving.

The above-described methods according to the present invention can be realized in hardware or as software or computer code that can be stored in a recording medium such as a CD ROM, an RAM, a floppy disk, a hard disk, or a magneto-optical disk or downloaded over a network, so that the methods described herein can be executed by such software using a general purpose computer, or a special processor or in programmable or dedicated hardware, such as an ASIC or FPGA. As would be understood in the art, the computer, the processor or the programmable hardware include memory components, e.g., RAM, ROM, Flash, etc. that may store or receive software or computer code that when accessed and executed by the computer, processor or hardware implement the processing methods described herein. As is apparent from the foregoing description, the use of the present invention can improve the performance of a communication system using an LDPC codeword encoding scheme. In addition, the use of the scheme disclosed herein improves decoding performance of the LDPC code. In particular, the present invention improves reliabilities of bits having lower error correction capability among the bits constituting the LDPC code. Further, the present invention increases link performance in a wireless channel environment where there is a high probability that the link performance will decrease due to noises, fading phenomenon and ISI, thereby contributing to improvement of reliability of data transmission/reception. In addition, according to the present invention, the reliable transmission/reception of the LDPC code reduces error probability of signals in the entire communication system, enabling high-speed communication.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for transmitting data in a communication system using a Low Density Parity Check (LDPC) codeword, the method comprising:
generating an LDPC codeword by encoding information data bits;
interleaving LDPC codeword bits included in the LDPC codeword;
generating a mapped signal by mapping the interleaved LDPC codeword bits separately to a bit corresponding to a real part of modulation symbol bits in a modulation symbol and a bit corresponding to an imaginary part of the modulation symbol bits, the mapping being performed on the basis of degrees of the interleaved LPDC codeword bits and relative reliabilities of the modulation signal bits; and
generating a modulation signal by high-order-modulating the mapped signal.

2. The method of claim 1, wherein interleaving comprises:
writing the LDPC codeword bits in an interleaver column by column, wherein the number of columns of the interleaver is equal to the number of the modulation symbol bits, and the number of rows of the interleaver is equal to the number obtained by dividing the number of the LDPC codeword bits by the number of the columns; and
reading one bit from each column of the interleaver in which the LDPC codeword bits are written, on a row-by-row basis.

3. The method of claim 2, wherein the LDPC codeword bits are ordered before undergoing interleaving in one of: a descending-order from a higher-degree bit, and in an ascending-ordered from a lower-degree bit.

4. The method of claim 1, wherein
the interleaved LDPC codeword bits have different degrees, a reliability of the bit corresponding to the real part of the modulation symbol bits is equal to a reliability of the bit corresponding to the imaginary part of the modulation symbol bit.

5. The method of claim 1, wherein generating the mapped signal comprises:
generating the mapped signal by mapping at least some higher-degree LDPC codeword bits to higher-reliability modulation symbol bits among the modulation symbol bits, and mapping lower-degree LDPC codeword bits to medium-reliability modulation symbol bits among modulation symbol bits except for the higher-reliability modulation symbol bits,
wherein the number of the higher-degree LDPC codeword bits is equal to the number of the higher-reliability modulation symbol bits, and the number of the lower-degree LDPC codeword bits is equal to the number of the medium-reliability symbol bits.

6. The method of claim 1, wherein generating the mapped signal comprises:
if the number of LDPC codeword bits is N and the modulation signal is generated using a 256-ary Quadrature Amplitude Modulation (256-QAM) modulation scheme, dividing the interleaved LDPC codeword bits into 8 groups in descending order of a degree;
mapping interleaved LDPC codeword bits belonging to a first group to highest-reliability bits corresponding to one of the imaginary part and the real part of the modulation symbol bits;
mapping interleaved LDPC codeword bits belonging to a second group to medium-reliability bits corresponding to one of the imaginary part and the real part of the modulation symbol bits;
mapping interleaved LDPC codeword bits belonging to a third group to lowest-reliability bits corresponding to one of the imaginary part and the real part of the modulation symbol bits;
mapping interleaved LDPC codeword bits belonging to a fourth group to the remaining bits having the same reliability as the bits to which the third group is mapped; and
mapping interleaved LDPC codeword bits belonging to fifth to eighth groups to the remaining bits which are not mapped to the first to fourth groups.

7. An apparatus for transmitting data in a communication system using a Low Density Parity Check (LDPC) codeword, the apparatus comprising:
an encoder for encoding information data bits and outputting an LDPC codeword;
an interleaver for interleaving LDPC codeword bits included in the LDPC codeword;
a bit mapper for outputting a mapped signal by mapping the interleaved LDPC codeword bits separately to a bit corresponding to a real part of modulation symbol bits in a modulation symbol and a bit corresponding to an imaginary part of the modulation symbol bits, the mapping being performed on the basis of degrees of the interleaved LDPC codeword bits and relative reliabilities of modulation symbol bits; and
a modulator for high-order-modulating the mapped signal, and outputting a modulation signal.

8. The apparatus of claim 7, wherein the interleaver:
writes the LDPC codeword bits in the interleaver column by column, wherein the number of columns of the interleaver is equal number of the modulation symbol bits, and the number of rows of the interleaver is equal to the number obtained by dividing the number of the LDPC codeword bits by the number of the columns; and read one bit from each column in which the LDPC codeword bits are written, on a row-by-row basis.

9. The apparatus of claim 8, wherein the interleaver is further configured to order the LDPC codeword bits before undergoing interleaving in a manner selected from: a descending-order from a higher-degree bit, or an ascending-order from a lower-degree bit.

10. The apparatus of claim 7, the interleaved LDPC codeword bits have different degrees, a reliability of the bit corresponding to the real part of the modulation symbol bits is equal to a reliability of the bit corresponding to the imaginary part of the modulation symbol bits.

11. The apparatus of claim 7, wherein the bit mapper is configured to output the mapped signal by mapping at least some higher-degree LDPC codeword bits to higher-reliability modulation symbol bits among the modulation symbol bits, and mapping lower-degree LDPC codeword bits to medium reliability modulation symbol bits among modulation symbol bits except for the higher-reliability modulation symbol bits,
wherein the number of the higher-degree LDPC codeword bits is equal to the number of the higher-reliability modulation symbol bits, and the number of the lower-degree LDPC codeword bits equal to the number of the medium-reliability modulation symbol bits.

12. The apparatus of claim 7, wherein the bit mapper is configured to:
if the number of LDPC codeword bits is N and the modulation signal is generated using a 256-ary Quadrature Amplitude Modulation (256-QAM) modulation scheme, divide the interleaved LDPC codeword bits into 8 groups in descending order of a degree;

map interleaved LDPC codeword bits belonging to a first group to highest-reliability bits corresponding to one of the imaginary part and the real part of the modulation symbol bits;

map interleaved LDPC codeword bits belonging to a second group to medium-reliability bits corresponding to one of the imaginary part and the real part of the modulation symbol bits;

map interleaved LDPC codeword bits belonging to a third group to lowest-reliability bits corresponding to one of the imaginary part and the real part of the modulation symbol bits;

map interleaved LDPC codeword bits belonging to a fourth group to the remaining bits having the same reliability as the bits to which the third group is mapped; and map interleaved LDPC codeword bits belonging to fifth to eighth groups to the remaining bits which are not mapped to the first to fourth groups.

13. A method for receiving data in a communication system using a Low Density Parity Check (LDPC) codeword, the method comprising:

processing a signal received through a reception antenna;

generating a demodulation symbol by demodulating the processed signal;

generating LDPC codeword bits by demapping the LDPC codeword bits separately to a bit corresponding to a real part of modulation symbol bits in the demodulation symbol and a bit corresponding to an imaginary part of the demodulation symbol bits, the demapping being performed on the basis of degrees of the LDPC codeword bits and relative demodulation symbol bits;

deinterleaving the demapped LDPC codeword bits; and decoding the deinterleaved LDPC codeword bits.

14. An apparatus for receiving data in a communication system using a Low Density Parity Check (LDPC) matrix, the apparatus comprising:

a Radio Frequency (RF) processor for RF-processing a signal received through a reception antenna;

a demodulator for demodulating the RF-processed signal and outputting a demodulation symbol;

a bit de-mapper for outputting LDPC codeword bits by de-mapping the LDPC codeword bits separately to a bit corresponding to a real part of the modulation symbol bits in the demodulation symbol and a bit corresponding to an imaginary part of the demodulation symbol bits, the demapping being performed on the basis of degrees of LDPC codeword bits and relative reliabilities of demodulation symbol bits;

a deinterleaver for deinterleaving the bit-de-mapped LDPC codeword bits; and a decoder for decoding the deinterleaved LDPC codeword bits.

15. A recording medium storing code which when executed by a processor causes a communication system device to perform the steps of:

receiving an input data stream of information data bits;

generating an LDPC codeword by encoding the received information data bits;

interleaving LDPC codeword bits included in the LDPC codeword;

generating a mapped signal by mapping the interleaved LDPC codeword bits separately to a bit corresponding to a real part of modulation symbol bits in a modulation symbol and a bit corresponding to an imaginary part of the modulation symbol bit, the mapping being performed on the basis of degrees of the interleaved LDPC codeword bits and relative reliabilities of modulation symbol bits;

generating a modulation signal by high-order-modulating the mapped signal; and providing the high-order modulated mapped signal to a transmitter.

16. The recording medium of claim 15, wherein in interleaving the LDPC codeword, the processor:

writes the LDPC codeword bits in an interleaver column by column, wherein the number of columns of the interleaver is equal to the number of the modulation symbol bits, and the number of rows of the interleaver is equal to the number obtained by dividing the number of the LDPC codeword bits by the number of the columns; and read one bit from each column in which the LDPC codeword bits are written, on a row-by-row basis.

17. The recording medium of claim 16, wherein the LDPC codeword bits are ordered before undergoing interleaving in one of: a descending-order from a higher-degree bit, and in an ascending-ordered from a lower-degree bit.

18. The recording medium of claim 15, wherein the interleaved LDPC codeword bits have different degrees, a reliability of the bit corresponding to the real part of the modulation symbol bits is equal to a reliability of the bit corresponding to the imaginary part of the modulation symbol bits.

19. The recording medium of claim 15, wherein generating the mapped signal comprises:

mapping at least some higher-degree LDPC codeword bits to higher-reliability modulation symbol bits among the modulation symbol bits; and mapping lower-degree LDPC codeword bits to medium-reliability modulation symbol bits among modulation symbol bits except for the higher-reliability modulation symbol bits, wherein the number of the higher-degree LDPC codeword bits is equal to the number of the higher-reliability modulation symbol bits, and the number of the lower-degree LDPC codeword bits is equal to the number of the medium-reliability modulation symbol bits.

20. The recording medium of claim 15, wherein in generating the mapped signal, the processor:

divides the LDPC codeword bits into 8 groups in descending order of a degree if the number of LDPC codeword bits is N and the modulation signal is generating using 256-ary Quadrature Amplitude Modulation (256-QAM) modulation;

maps interleaved LDPC codeword bits belonging to a first group to highest-reliability bits corresponding to one of the imaginary part and the real part of the modulation symbol bits;

maps interleaved LDPC codeword bits belonging to a second group to medium-reliability bits corresponding to one of the imaginary part and the real part of the modulation symbol bits;

maps interleaved LDPC codeword bits belonging to a third group to lowest-reliability bits corresponding to one of the imaginary part and the real part among the modulation symbol bits;

maps interleaved LDPC codeword bits belonging to a fourth group to the remaining bits having the same reliability as the bits to which the third group is mapped; and maps interleaved LDPC codeword bits belonging to fifth to eighth groups to the remaining bits which are not mapped to the first to fourth groups.

* * * * *

UNITED STATES PATENT AND TRADEMARK OFFICE
CERTIFICATE OF CORRECTION

PATENT NO.          : 8,230,295 B2                                    Page 1 of 1
APPLICATION NO.     : 12/267658
DATED               : July 24, 2012
INVENTOR(S)         : Hong-Sil Jeong et al.

It is certified that error appears in the above-identified patent and that said Letters Patent is hereby corrected as shown below:

Column 15, Claim 5, Line 56 should read as follows:
--...medium-reliability modulation symbol...--

Column 16, Claim 11, Line 61 should read as follows:
--...codeword bits is equal to...--

Signed and Sealed this
Thirteenth Day of November, 2012

David J. Kappos
*Director of the United States Patent and Trademark Office*